(12) United States Patent
Gillard et al.

(10) Patent No.: US 8,988,897 B2
(45) Date of Patent: Mar. 24, 2015

(54) ELECTROMAGNETIC INTERFERENCE MODE STIRRER

(71) Applicant: International Business Machines Corporation, Armonk, NY (US)

(72) Inventors: Edward C. Gillard, Mantorville, MN (US); Don A. Gilliland, Rochester, MN (US); John S. Maas, Kasson, MN (US)

(73) Assignee: International Business Machines Corporation, Armonk, NY (US)

( * ) Notice: Subject to any disclaimer, the term of this patent is extended or adjusted under 35 U.S.C. 154(b) by 284 days.

(21) Appl. No.: 13/686,394

(22) Filed: Nov. 27, 2012

(65) Prior Publication Data

US 2014/0146512 A1 May 29, 2014

(51) Int. Cl.
*H05K 9/00* (2006.01)

(52) U.S. Cl.
CPC ............ *H05K 9/0052* (2013.01); *H05K 9/0062* (2013.01)
USPC ............................ 361/818; 361/817; 174/350

(58) Field of Classification Search
CPC .................. H05K 9/0052; H05K 96/0062
USPC ..................... 361/816, 817, 818; 174/350
See application file for complete search history.

(56) References Cited

U.S. PATENT DOCUMENTS

| | | | | |
|---|---|---|---|---|
| 5,336,896 | A * | 8/1994 | Katz | 250/515.1 |
| 6,192,598 | B1 * | 2/2001 | Halverson et al. | 34/174 |
| 7,274,549 | B2 * | 9/2007 | Anthony | 361/111 |
| 7,379,308 | B2 | 5/2008 | Hailey et al. | |
| 7,532,473 | B2 | 5/2009 | Kuo | |
| 7,589,978 | B1 | 9/2009 | Holdredge et al. | |
| 7,745,552 | B2 * | 6/2010 | Kiss et al. | 526/88 |
| 7,885,069 | B2 * | 2/2011 | Fredericksen et al. | 361/695 |
| 7,897,882 | B1 | 3/2011 | Willwerth et al. | |
| 8,085,554 | B2 | 12/2011 | Holdredge et al. | |
| 2002/0148626 | A1 | 10/2002 | Matsumura et al. | |
| 2007/0047177 | A1 * | 3/2007 | Anthony | 361/321.2 |
| 2007/0242443 | A1 | 10/2007 | Hailey et al. | |
| 2010/0208433 | A1 * | 8/2010 | Heimann et al. | 361/724 |
| 2010/0311275 | A1 * | 12/2010 | Fredericksen et al. | 439/620.09 |
| 2012/0312810 | A1 * | 12/2012 | Blankenbeckler et al. | 219/759 |
| 2013/0000358 | A1 * | 1/2013 | Yamamoto et al. | 65/135.3 |

FOREIGN PATENT DOCUMENTS

JP          08288440          11/1996

* cited by examiner

*Primary Examiner* — David M Sinclair
*Assistant Examiner* — Robert Brown
(74) *Attorney, Agent, or Firm* — Jason H. Sosa

(57) ABSTRACT

An apparatus for distributing electromagnetic waves comprising a first plurality of plates coupled to a first rod. A second plurality of plates coupled to a second rod, wherein at least one of either the first or the second plurality of plates is capable of reflecting an electromagnetic wave. A portion of the second rod is situated inside the first rod. A first motor mechanically connected to the first rod, such that the first motor is capable of rotating the first rod. A second motor mechanically connected to the second rod, such that the second motor is capable of rotating the second rod, wherein rotational direction and speed of the second rod, when rotated by the second motor is independent of rotational direction and speed of the first rod, when rotated by the first motor.

20 Claims, 5 Drawing Sheets

US 8,988,897 B2

ELECTROMAGNETIC INTERFERENCE MODE STIRRER

FIELD OF THE INVENTION

This disclosure relates generally to reducing electromagnetic interference (EMI) in an electronic device, and in particular, to enclosures containing resonant electromagnetic fields.

BACKGROUND OF THE INVENTION

For purposes of this disclosure, the term electromagnetic interference (EMI) is understood to refer to electromagnetic emission and radiation that includes both electromagnetic interference and radio-frequency interference (RFI). Both of these types of interference generate electromagnetic fields that can interfere with the operation of adjacent electrical equipment. It is desirable to protect electronic devices from external EMI, and also to prevent internal EMI from escaping and possibly interfering with other electronic devices in the vicinity. To accomplish this, EMI shields comprised of EMI absorbing material are often used in enclosures containing electronic equipment, components, and/or circuitry (e.g., computers and test equipment).

EMI absorbing material provides highly efficient EMI attenuation. However, when dealing with electronic devices generating high levels of EMI within an enclosure, EMI absorbing material is only partially effective in EMI attenuation. Enclosures of electronic devices typically allow for an amplified effect due to EMI. This is due in part to resonance of the EMI waves within the enclosure. Resonance can amplify the EMI occurring in the form of standing waves in the enclosure thus having a greater affect on the electronic devices in the path of these waves. The formation of electromagnetic standing waves produces spikes in amplitude of this interference in areas within the enclosure.

Mode stirrers typically used in reverberation chambers have the ability to distribute these EMI waves in an enclosure in a homogeneous manner. Mode stirrers distribute these EMI waves to eliminate standing waves through resonance by reflecting these waves throughout the enclosure and establishing a uniform statistical distribution of fields throughout the volume. This lowers the net field strength in an area where seams and apertures are located, thus lowering the radiation outside the enclosure from these seams and apertures.

SUMMARY

One aspect of an embodiment of the present invention discloses an apparatus for distributing electromagnetic waves comprising, a first plurality of plates coupled to a first rod. A second plurality of plates coupled to a second rod, wherein at least one of either the first or the second plurality of plates is capable of reflecting an electromagnetic wave. A portion of the second rod is situated inside the first rod. A first motor mechanically connected to the first rod, such that the first motor is capable of rotating the first rod. A second motor mechanically connected to the second rod, such that the second motor is capable of rotating the second rod, wherein rotational direction and speed of the second rod, when rotated by the second motor is independent of rotational direction and speed of the first rod, when rotated by the first motor.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

Figure 1:
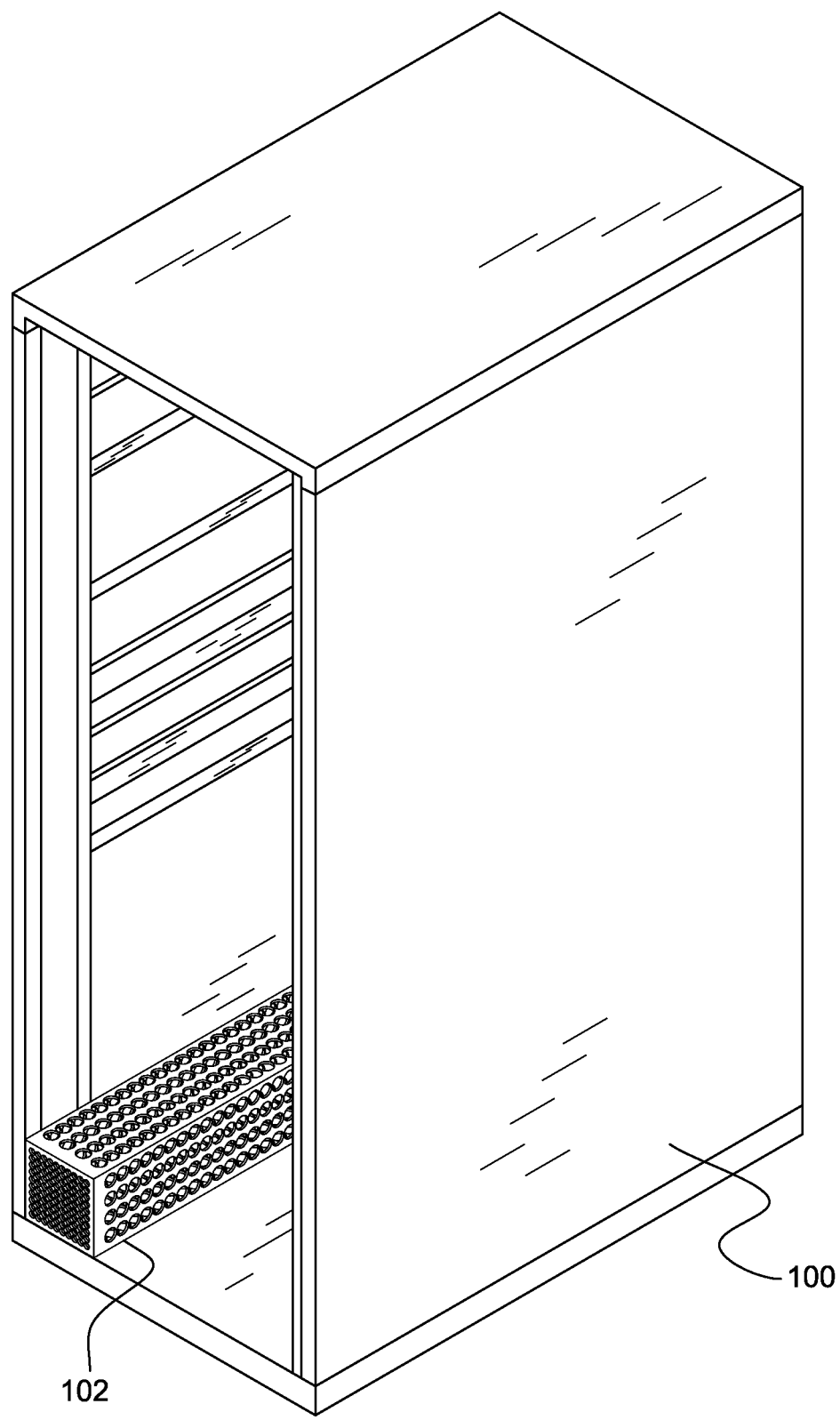
FIG. 1 depicts an electronic device enclosure in accordance with an embodiment of the present invention.

FIG. 1 depicts an electronic device enclosure in accordance with an embodiment of the present invention. In one embodiment, enclosure 100 is a server rack. In another embodiment, enclosure 100 is a computer tower. In other embodiments, enclosure 100 may be any enclosure designed to contain various electronic devices or components that generate heat and/or electromagnetic emissions during operation. Enclosure 100 is preferably composed of a metal or other conducting material and preferably forms a large portion of a Faraday cage to block electric fields and electromagnetic emissions. Enclosure 100 preferably contains a minimal amount of openings. EMI mode stirrer 102 is meant to be horizontally placed within enclosure 100 in a location dependent on what electronic devices are contained within and is preferably composed of a non-metal. Since, every enclosure 100 is able to hold various electronic devices which emit various ranges of EMI frequency, the location of the EMI mode stirrer further depends on the frequencies emitted and the location of electronic circuitry and devices in enclosure 100. In one embodiment, EMI mode stirrer 102 can be located on the bottom of enclosure 100 and in another embodiment EMI mode stirrer 102 can be located towards the top of enclosure 100. In another embodiment, multiple EMI mode stirrers can be used in applications of heavy EMI areas containing a greater range of frequencies or in applications with large enclosures 100.

Figure 2:
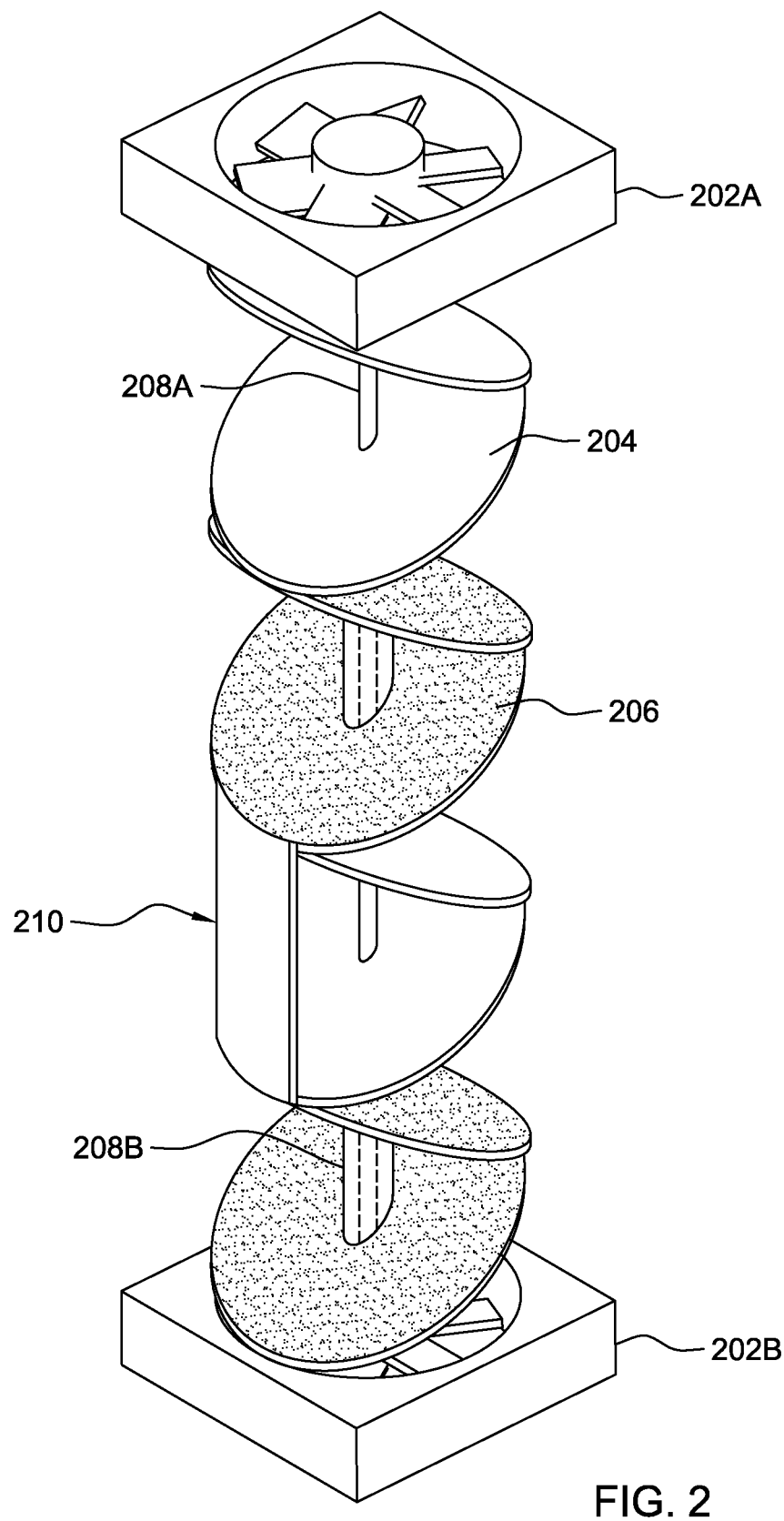
FIG. 2 depicts an EMI mode stirrer in accordance with one embodiment of the present invention.

FIG. 2 depicts an isometric view of EMI mode stirrer 102 in accordance with one embodiment of the present invention.

EMI mode stirrer 102 comprises two variable rotational speed motors designated 202A and 202B. The respective direction and rotational speed of motor 202A and motor 202B is dependent on the speed required to match the resonance frequency, which creates a destructive interference negating resonant EMI waves present in enclosure 100. In this embodiment, motor 202A and motor 202B are each joined to a fan to provide additional cooling in enclosure 100.

In one embodiment, motor 202A rotates rod 208A and motor 202B rotates hollow rod 208B on an axis. The axis of rotation for motor 202A is the same axis of rotation for rod 208A. The axis of rotation for motor 202B is the same axis of rotation for hollow rod 208B. Rod 208A and hollow rod 208B are concentric with rod 208A rotating inside hollow rod 208B. In a preferred embodiment, rod 208A and hollow rod 208B are preferably composed of an alloy metal. Hollow rod 208B can have a set of bearings in which rod 208A can rotate in.

Reflective plates 204 are joined to rod 208A in sets of two so that the center axis of rotation of the reflective plates 204 aligns with the center axis of rotation of rod 208A. A set of reflective plates 204 are joined on one side to form a "V" arrangement and a set of absorbent plates 206 are joined on one side to form a "V" arrangement. Absorbent plates 206 are joined to hollow rod 208B in sets of two so that the center axis of rotation of the absorbent plates 206 align with the center axis of rotation of hollow rod 208B. Each reflective plate 204 is fixed to rod 208A and rotates with the same rotational speed as rod 208A. Each absorbent plate 206 is fixed to hollow rod 208B and rotates with the same rotational speed as hollow rod 208A. Every reflective plate 204 is preferably of an EMI reflective material. EMI reflective material can be but is not limited to: steel, copper, aluminum, carbon-loaded plastic or high dielectric ceramic. Every absorbent plate 206 is preferably of an EMI absorbent material. EMI absorbent material is any type of material comprising some form of magnetic property. In the preferred embodiment, the shape of reflective plate 204 and absorbent plate 206 is a circle but in other embodiments can take on any symmetrical shape.

Depending on enclosure 100 and the frequencies being emitted by the electronic devices, the number of sets of reflective plates 204 and absorbent plates 206 varies. For example, where enclosure 100 is a large enclosure storing many electronic devices, the range of frequency of the EMI may be greater. The size and the number of the reflective plates 204 and absorbent plates 206 can be altered to compensate for the size of enclosure 100.

In one embodiment, reflective plates 204 and absorbent plates 206 alternate on EMI mode stirrer 102 by sets of two. To allow reflective plates 204 to rotate at a speed set by motor 202A and absorbent plates 206 to rotate at a speed set by motor 202B, where the speed may be different. Alternating sets of plates are connected in a fashion to allow rotation independent of an intermediate set of plates. Towards that end, in one embodiment, each set of absorbent plates 206 is connected by plate 210. This allows absorbent plates 206, connected to hollow rod 208B to rotate independent of reflective plates 204 connected to rod 208A. Plate 210 is preferably of an alloy metal so it does not interfere with the rotational balance of EMI mode stirrer 102.

Figure 3:
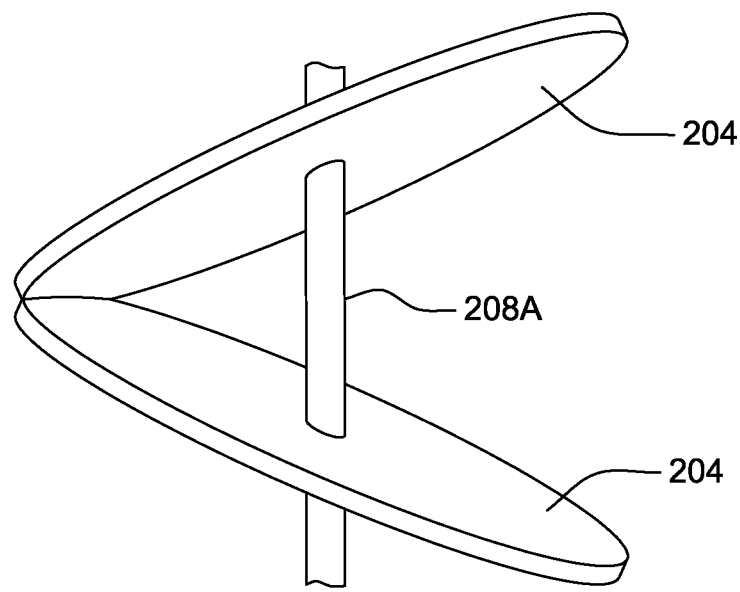
FIG. 3 depicts a preferred alignment of reflective paddles on a rotational rod of the EMI mode stirrer of FIG. 2.

FIG. 3 depicts an isometric view of a preferred alignment of two reflective plates 204 on rod 208A. The two reflective plates 204 are fixed to rod 208A at a given angle. In a preferred embodiment the two reflective plates 204 are arranged in a clam-shell or "V" arrangement where the two plates contact each other at one end at an angle between 1 degree and 179 degrees. Optimal angles are such as to produce the maximum number of reflections and re-reflections on the inside surfaces. The center of the reflective plates 204 is concentric to the center of rod 208A.

Figure 4:
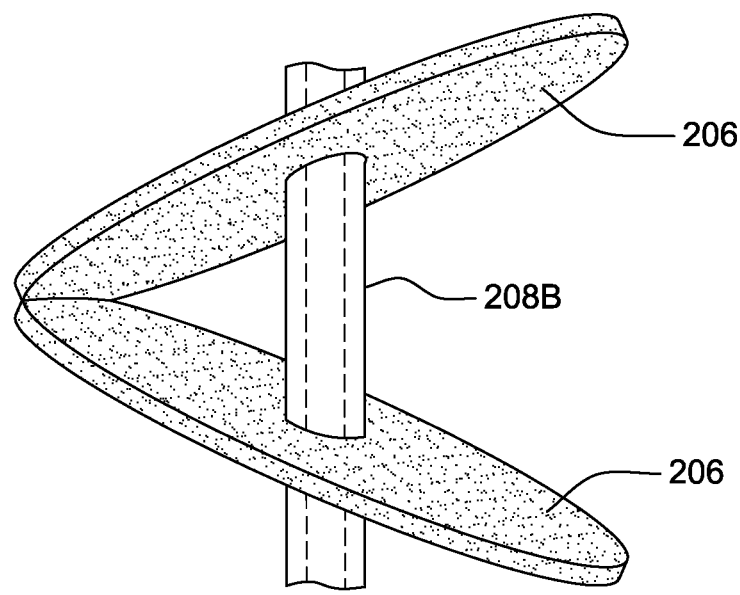
FIG. 4 depicts a preferred alignment of absorber paddles on the rotational rod of the EMI mode stirrer of FIG. 2.

FIG. 4 depicts an isometric view of a preferred alignment of two absorbent plates 206 on hollow rod 208B. The two absorbent plates 206 are joined to hollow rod 208B at a given angle. In a preferred embodiment the two absorbent plates 206 are arranged in a clam-shell arranged where the given angle between the two absorbent plates 206 ranges between 1 degree and 179 degrees. The center of the absorbent plates 206 is concentric to the center of hollow rod 208B.

Figure 5:
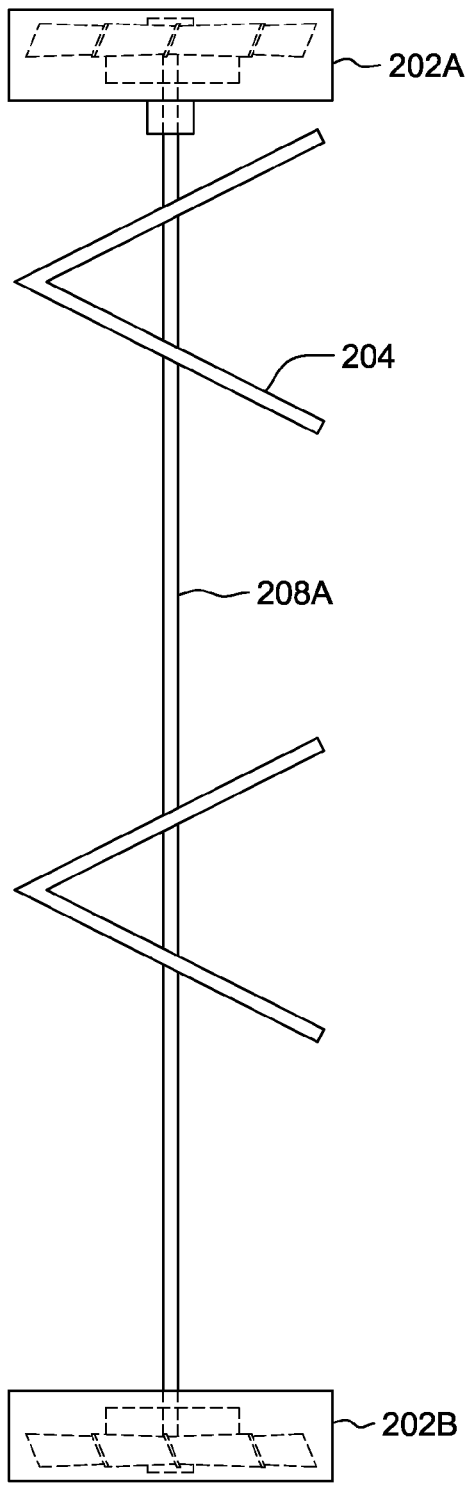
FIG. 5 depicts an inner rotational rod with attached reflective paddles of the EMI mode stirrer of FIG. 2.

FIG. 5 depicts an orthographical view of inner rotational rod 208A with attached reflective paddles 204 of EMI mode stirrer 102.

Figure 6:
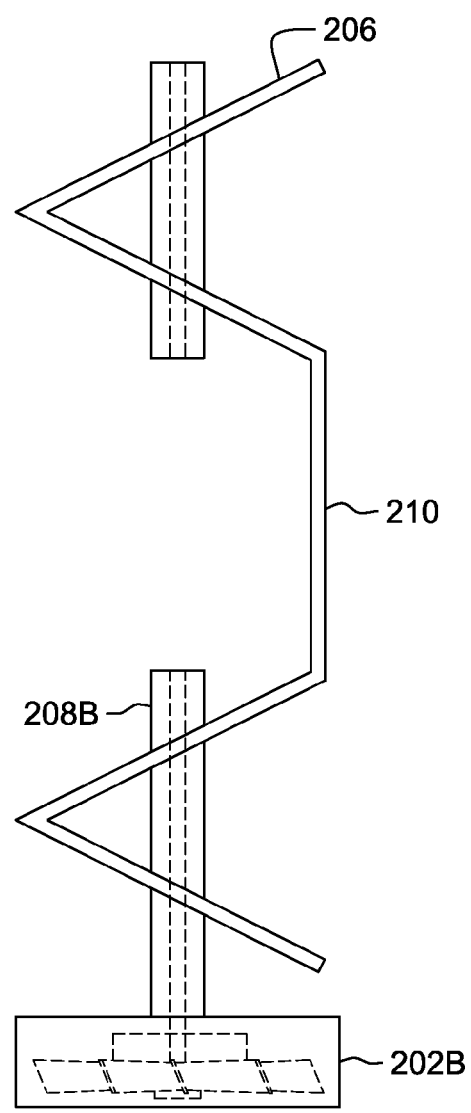
FIG. 6 depicts an outer rotational tube with attached absorber paddles of the EMI mode stirrer of FIG. 2.

FIG. 6 depicts an orthographical view of outer rotational hollow rod 208B with attached absorbent paddles 206 of EMI mode stirrer 102. As previously mentioned in the discussion of FIG. 2, plate 210 allows absorbent plates 206 connected to hollow rod 208B to rotate independent of reflective plates 204 connected to rod 208A. Plate 210 connects the two sets of absorbent plates 206 so they rotate in synchronization.

Figure 7:
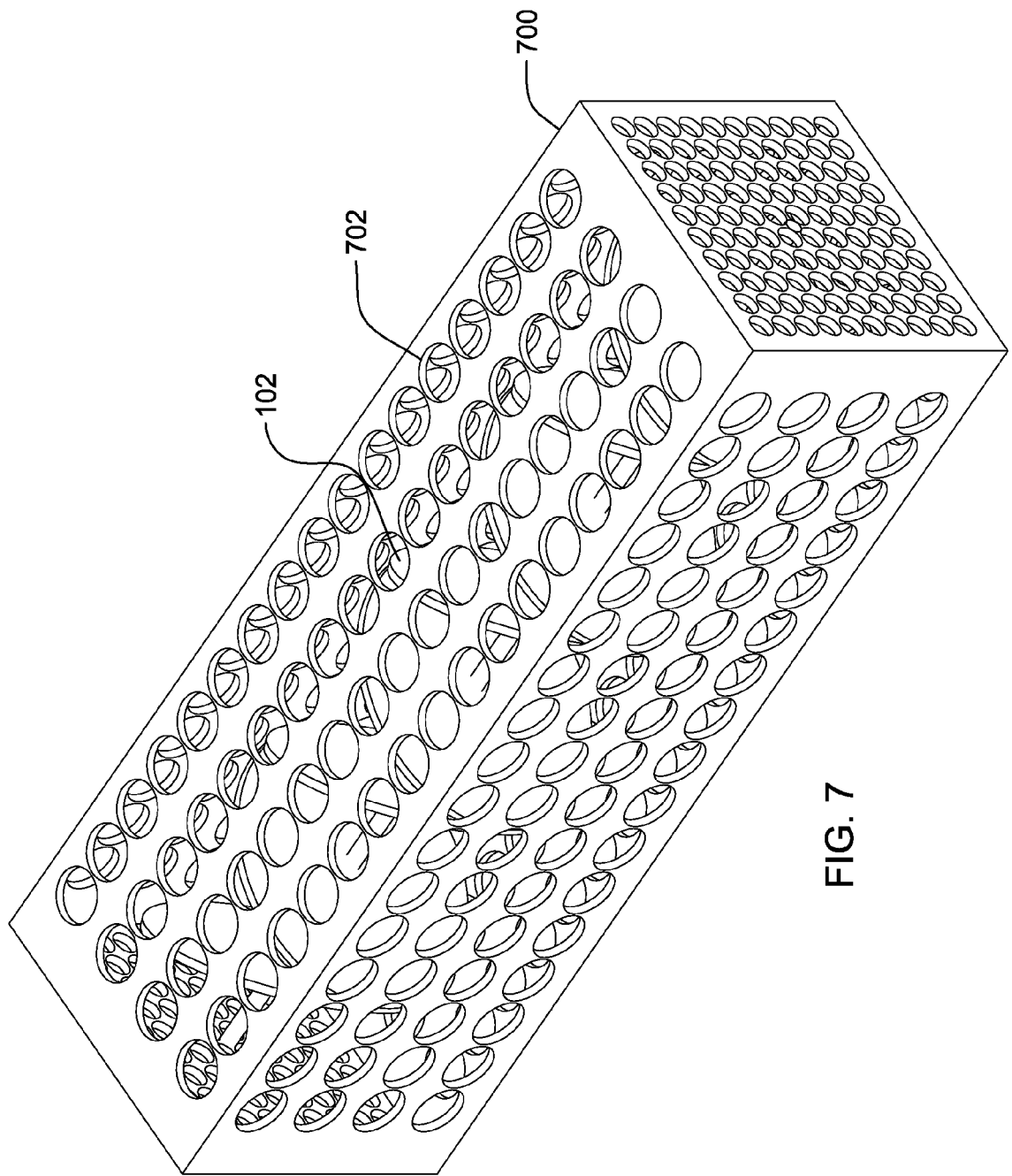
FIG. 7 depicts a safety enclosure encompassing the EMI mode stirrer of FIG. 2.

FIG. 7 depicts a full view of safety enclosure 700 encompassing EMI mode stirrer 102. Safety enclosure 700 is preferably composed of a non-conducting material. In one embodiment, safety enclosure 700 is a rectangular box comprised of an electromagnetic dissipative (i.e., lossy) grid of holes 702 through which the EMI waves may pass through to be effectively absorbed or reflected by EMI mode stirrer 102. The grid of holes 702 covers each side of the rectangular box. Holes 702 on safety enclosure 700 can be any shape and the holes are preferably of a size through which a person's finger cannot pass through. In a preferred embodiment, holes 702 would be round with a diameter ranging between 0.75 mm to 1.25 mm.

The terminology used herein is for the purpose of describing particular embodiments only and is not intended to be limiting to the invention. As used herein, the singular forms "a", "an" and "the" are intended to include the plural forms as well, unless the context clearly indicates otherwise.

Having described preferred embodiments of an EMI mode stirrer (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. An apparatus for distributing electromagnetic waves, the apparatus comprising:
    a first plurality of plates coupled to a first rod;
    a second plurality of plates coupled to a second rod, wherein at least one of either the first or the second plurality of plates is capable of reflecting an electromagnetic wave;
    a portion of the second rod is situated inside the first rod;
    a first motor mechanically connected to the first rod, such that the first motor is capable of rotating the first rod; and
    a second motor mechanically connected to the second rod, such that the second motor is capable of rotating the second rod, wherein rotational direction and speed of the second rod, when rotated by the second motor is independent of rotational direction and speed of the first rod, when rotated by the first motor.

2. The apparatus of claim 1, wherein at least one of either the first or the second plurality of plates is capable of absorbing an electromagnetic wave.

3. The apparatus of claim 1, further comprising:
    a third plurality of plates coupled to a third rod, wherein the second rod passes through the third rod; and
    the first motor mechanically connected to the third rod, such that when the first motor rotates the first rod, the third rod rotates with the same rotational direction and speed as the first rod.

4. The apparatus of claim 3, wherein the third rod is situated a distance apart from the first rod, and wherein at least one of the second plurality of plates coupled to the second rod is situated between the first and third rod.

5. The apparatus of claim 3, further comprising:
a member connecting one of the first plurality of plates coupled to the first rod with one of the third plurality of plates coupled to the third rod, such that the first rod dictates the rotational direction and speed of the third rod.

6. The apparatus of claim 3, wherein the third plurality of plates comprises of at least two plates joined at one end.

7. The apparatus of claim 3, wherein the third plurality of plates is at least one of either capable of absorbing an electromagnetic wave or reflecting an electromagnetic wave.

8. The apparatus of claim 3, wherein the first rod and the third rod have hollow centers.

9. The apparatus of claim 8, wherein the hollow centers of the first rod and the third rod each have two or more pressed bearings.

10. The apparatus of claim 3, wherein a depth or a size of the third plurality of plates is determined in accordance with a frequency of the electromagnetic interference waves.

11. The apparatus of claim 3, wherein the shape of the third plurality of plates is determined in accordance with a frequency of the electromagnetic interference waves.

12. The apparatus of claim 3, further comprising:
a center axis of rotation of the first plurality of plates coupled to the first rod passes through a center axis of rotation of the first rod;
a center axis of rotation of the second plurality of plates coupled to the second rod passes through a center axis of rotation of the second rod; and
a center axis of rotation of the third plurality of plates coupled to the third rod passes through a center axis of rotation of the third rod.

13. The apparatus of claim 3, further comprising:
the center axis of rotation of the first rod passes through a center axis of rotation of the first motor;
the center axis of rotation of the second rod passes through a center axis of rotation of the second motor; and
the center axis of rotation of the third rod passes through the center axis of rotation of the first motor.

14. The apparatus of claim 1, wherein the first plurality of plates comprises of at least two plates joined at one end.

15. The apparatus of claim 1, wherein the second plurality of plates comprises of at least two plates joined at one end.

16. The apparatus of claim 1, wherein the first and second motor each have attached fan blades.

17. The apparatus of claim 1, wherein the apparatus is encompassed in an enclosure.

18. The apparatus of claim 17, wherein the enclosure comprises of a grid of apertures.

19. The apparatus of claim 1, wherein a depth or a size of the first and second plurality of plates is determined in accordance with a frequency of the electromagnetic interference waves.

20. The apparatus of claim 1, wherein the shape of the first and second plurality of plates is determined in accordance with a frequency of the electromagnetic interference waves.

* * * * *